(12) United States Patent
Lee

(10) Patent No.: US 6,177,309 B1
(45) Date of Patent: Jan. 23, 2001

(54) METHODS OF FORMING INTEGRATED CIRCUIT CAPACITORS HAVING MERGED ANNULAR STORAGE ELECTRODES THEREIN

(75) Inventor: Se-Hyeong Lee, Kyonggi-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/333,444

(22) Filed: Jun. 15, 1999

(30) Foreign Application Priority Data

Jun. 15, 1998 (KR) .................................................. 98-22257
Apr. 9, 1999 (KR) .................................................. 99-12577

(51) Int. Cl.⁷ ............................................. H01L 21/8242
(52) U.S. Cl. ...................... 438/253; 438/254; 438/255; 438/396; 438/397; 438/398; 257/396; 257/306
(58) Field of Search ................................. 438/253, 254, 438/255, 396, 397–398

(56) References Cited

U.S. PATENT DOCUMENTS

| | | | |
|---|---|---|---|
| 5,242,536 | * 9/1993 | Schoenborn | 156/643 |
| 5,608,247 | 3/1997 | Brown | 257/306 |
| 5,658,381 | 8/1997 | Thakur et al. | 257/309 |
| 5,663,090 | 9/1997 | Dennison et al. | 438/398 |
| 5,721,153 | 2/1998 | Kim et al. | 437/60 |
| 5,726,085 | 3/1998 | Crenshaw et al. | 438/255 |
| 5,798,280 | 8/1998 | Mathews et al. | 437/165 |
| 5,817,555 | 10/1998 | Cho | 438/253 |
| 5,837,580 | 11/1998 | Thakur et al. | 438/255 |
| 5,851,875 | * 12/1998 | Ping | 438/253 |
| 5,851,878 | * 12/1998 | Huang | 438/255 |
| 5,874,336 | 2/1999 | Cherng | 438/255 |
| 5,948,703 | * 9/1999 | Shen et al. | 438/714 |
| 5,956,587 | * 9/1999 | Chen et al. | 438/255 |
| 6,097,055 | * 8/2000 | Lee et al. | 257/309 |

* cited by examiner

Primary Examiner—Tom Thomas
Assistant Examiner—Nitin Parekh
(74) Attorney, Agent, or Firm—Myers Bigel Sibley & Sajovec

(57) ABSTRACT

A cylindrical storage capacitor for a memory cell is disclosed. The cylindrical storage capacitor has a first polysilicon layer for a storage electrode in contact with conductive plug, the first polysilicon layer being a cylindrical structure, and having a hemispherical grain silicon (HGS) grown only at inner and top surfaces of the first polycrystalline silicon layer. The HGS widens the effective surface area of the storage electrode, to thereby secure a target capacitance and prevent adjacent storage capacitors from being microbridged. Moreover, the cylindrical first polysilicon pattern layer of which the outer peripheral surface have a fine vertical profile can be obtained by applying the nitride film as an etch stopper when forming the opening part in a selected portion of the first insulating layer.

6 Claims, 7 Drawing Sheets

METHODS OF FORMING INTEGRATED CIRCUIT CAPACITORS HAVING MERGED ANNULAR STORAGE ELECTRODES THEREIN

BACKGROUND OF THE INVENTION

1. Field of the Invention

The present invention relates to a cylindrical storage capacitor for a memory cell and a method for fabricating the same, and more particularly to a cylindrical storage capacitor for a memory cell in which a hemispherical grain silicon (HGS) is grown only at the inner and top surfaces of a polycrystalline silicon (hereinafter referred to as "polysilicon") layer for use in the cylindrical storage electrode, capable of increasing a capacitance of the storage capacitor and securing a margin for the prevention of the contact misalignment between the storage electrode and a buried contact, and a method for fabricating such storage capacitor.

2. Description of the Related Art

Generally, memory cells of semiconductor memory devices, for example, dynamic random access memory (DRAM), include a transistor and a storage capacitor. When memory cell area is reduced for high integration of DRAM, the transistor area and the storage capacitor area on a semiconductor substrate are also reduced. This results in reduction in capacitance of a typical storage capacitor having a two-dimensional structure.

As capacitance of a storage capacitor is reduced, the ratio of signal to noise is lowered, and the soft error occurrence rate due to a particle is increased. Therefore, sufficient capacitance for the storage capacitor is required even though a high integration of DRAM is achieved.

To obtain a sufficient capacitance, there have been endeavours of reducing thickness of dielectric film, developing a new dielectric film having a large dielectric constant, or extending an effective surface area of the storage capacitor. Studies on dielectric films have been developed a lot, and the storage capacitor having a three-dimensional structure has been suggested to improve cell capacitance. The storage capacitor can be roughly classified into a trench type and a stacked type.

In the trench type storage capacitor, a trench is formed on a semiconductor substrate and a dielectric film and a polysilicon layer for use as electrode are deposited in the trench, which may cause complexity in a manufacturing process. Moreover, an electric leakage or a punch through between trenches is likely to occur.

In the stacked type storage capacitor, a dielectric film and a polysilicon layer for use as electrode are deposited on a semiconductor substrate, which simplifies a manufacturing process while eliminating such electrical problems. Accordingly, the stacked type storage capacitor is gaining in popularity.

As the DRAM becomes highly integrated in a limited area, the storage capacitor area in the memory cell is also reduced. Therefore, it is not easy to obtain a target capacitance for the stacked type storage capacitor. To overcome such problem, a method of making a storage electrode made of a polysilicon layer higher as possible without bringing any damage to the storage electrode, has been proposed. In this method, the storage electrode has to be maintained at 10,000 Å or higher when considering the current memory cell area. If the storage electrode is 10,000 Å or lower, the target capacitance may not be obtained.

If the memory cell area is further reduced, the storage electrode has to be higher. The method of overcoming such problem was disclosed in "A new cylindrical capacitor using hemispherical grain silicon for 256 Mb DRAMs", by Watanabe in international electronic device & material (IEDM) 1992, pp. 259–262. In the paper, Watanabe applies a hemispherical grain silicon to the storage electrode of the storage capacitor, in which the hemispherical grain silicon is grown at the overall surface of a cylindrical storage electrode so as to extend an effective surface area of the storage electrode and thus obtain the target capacitance.

Since Watanabe, the method growing the hemispherical grain silicon at the surface of the storage electrode with maintaining the height of the storage capacitor at 10,000 Å or more has been widely used. However, this method has some disadvantages in application to mass production. In other words, margin of critical dimension is insufficient during the application of a photolithography or a dry etching process. In addition, a micro bridge may occur due to formation of the hemispherical grain silicon, which may cause a twin bit failure.

To prevent micro bridges, the storage electrode area in the limited memory cell area should be reduced. Then, such the reduction in the storage electrode area may cause misalignment between the buried contact and the storage capacitor. Therefore, it is difficult not only to secure a sufficient margin for the prevention of such the misalignment when considering critical dimension of the present photolithographic process, but complexity in process for fabricating such the memory cell is indispensable.

To overcome such problem, various new methods for forming storage electrodes have been proposed. As one method of them, there is provided a method for forming a cylindrical storage electrode where a single hole is formed in the stacked storage electrode so as to extend the surface area of the storage electrode. However, a number of processes are added in this method, which makes the manufacturing process more complicated.

Recently, a damascene process is employed in the formation of the cylindrical storage electrode in order to increase a capacitance of the storage capacitor and obtain sufficient margin against a misalignment with the buried contact. Here, an oxide film has to be vertically dry-etched to a desired depth so as to form an opening part corresponding to the storage electrode pattern.

However, the dry etching method may cause a tail in the lower edge portions of the etched surface if it is not over-etched, which prevents obtaining fine vertical profile of the etched surface. Thereafter, the storage electrode is formed within the opening part and the oxide film is then removed. Subsequently, when a dielectric film and a polysilicon layer for a plate electrode are deposited in the order named on the surface of the storage electrode and an insulator film is deposited thereon, a void is caused in the region where the tail exists.

In addition, the polysilicon layer for formation of the storage electrode is deposited on the oxide film having the opening part and the polysilicon layer except for the opening part is then polished by a chemical and mechanical polishing process. Thereafter, the oxide is removed by a wet etch. At this time, the tail may not be completely removed when the oxide film is lift off by such the wet etch. Therefore, the oxide film has to be over-etched for a complete removal of the tail. The amount of wet-etched oxide film depends on the time spent in the wet etching. Therefore, it is very difficult not only to control such the wet etch time but process reproduction is lowered.

Micro bridge is likely to occur when the hemispherical grain silicon is grown at the surface of the polysilicon layer for the storage electrode so as to increase a capacitance. Thus, sufficient margin for prevention of the twin bit failure may not be obtained. For preventing such shortcoming, if the outer bottom surface area of the storage electrode is reduced, the capacitance is also reduced. In addition, an area which the storage electrode contacts with the buried contact is reduced. Then, the margin against the contact misalignment between the storage electrode and the buried contact may not be obtained.

From such various reasons, the conventional method for fabricating cylindrical storage capacitor cannot be applied to a mass production of the storage capacitors.

SUMMARY OF THE INVENTION

It is therefore an object of the present invention to prevent adjacent cylindrical storage capacitors from being microbridged each other.

It is another object of the invention to secure the target capacitance of a cylindrical storage capacitor.

It is a further object of the invention to secure a margin for prevention of the misalignment between the storage electrode and the buried contact.

It is a still further object of the invention to allow an etched surface of an oxide to have a fine vertical profile, in which the oxide is deposited and is then selectively etched for formation of the opening part where the storage electrode is positioned during applying the damascene process.

To achieve the above objects and other advantages, there is provided a cylindrical storage capacitor for a memory cell. The cylindrical storage capacitor comprises: a semiconductor substrate having an upper surface on which a MOSFET having diffusion regions is formed; an insulating layer formed on the upper surface of said semiconductor substrate; a conductive plug formed in a through hole formed at a selected portion of the insulating layer such that the conductive plug electrically contacts with the diffusion region; a first polysilicon pattern layer for a storage electrode in contact with the conductive plug, the first polysilicon pattern layer being a cylindrical structure, and having a hemispherical grain silicon grown only at inner and top surfaces of the first polysilicon pattern layer; a dielectric layer stacked on the surface of the hemispherical grain silicon, the top surface and outer surface of the first polysilicon pattern layer; and a second polysilicon pattern layer for a plate electrode formed on the dielectric layer. Selectively, an etch stopper is placed on the insulating layer.

According to another aspect of the invention, a cylindrical storage capacitor for a memory cell comprises a polysilicon pattern layer for a storage electrode which is formed in at least two cylindrical structure, the polysilicon pattern layer being electrically in contact with the conductive plug, and having a hemispherical grain silicon grown only at inner and top surfaces of the polysilicon layer. Selectively, an etch stopper is placed on the insulating layer.

According to still another aspect of the invention, a storage capacitor for a memory cell comprises a conductive plug which is electrically in contact with the diffusion region of a semiconductor substrate, and is protruded by a selected height from the surface of the insulating layer for insulating word lines. The storage capacitor has a polysilicon pattern layer for a storage electrode of which the outer bottom surface is placed on the top surface of the conductive plug. A hemispherical grain silicon is grown only at the inner and top surfaces of the polysilicon pattern layer. In addition, the polysilicon pattern layer has a cylindrical structure having at least one, preferably two cylinders.

According to further still another aspect of the invention, a storage capacitor for a memory cell comprises a conductive plug which is electrically in contact with the diffusion region of a semiconductor substrate. The conductive plug has the same level in height with the top surface of the insulating layer for insulating word lines, or it can be protruded from the top surface of the insulating layer. The storage capacitor also has a cylindrical polysilicon pattern layer for a storage electrode of which the outer bottom surface is placed on the top surface of the conductive plug. The cylindrical polysilicon pattern layer has at least two cylinders, preferably two cylinders.

According to yet another aspect of the invention, there is provided a method for fabricating a cylindrical storage capacitor for a memory cell. The method comprises the steps of: providing a semiconductor substrate on which a MOSFET having diffused regions is formed; and forming a first insulating layer on the upper surface of said semiconductor substrate. Thereafter, a through hole is formed at a selected portion of the first insulating layer such that the diffused region is exposed. Afterwards, the through hole of the first insulating layer is filled with a conductive plug such that the conductive plug electrically contacts with said diffusion region. Thereafter, a second insulating layer is deposited on the first insulating layer including the conductive plug. Afterwards, an opening part for exposing a selected portion of the upper surface of the first insulating layer including the upper surface of the conductive plug is formed in the second insulating layer. Thereafter, a first polysilicon layer for a storage electrode is formed within the opening part, the first polysilicon layer being electrically in contact with the conductive plug, and being a cylindrical structure. Afterwards, a hemispherical grain silicon is grown only at inner and upper surfaces of the first polysilicon layer. The second insulating layer is then removed to expose the outer peripheral surface of the first polysilicon layer. Thereafter, a dielectric layer is formed on the surface of the hemispherical grain silicon, and the outer peripheral surface of the first polysilicon layer. Finally, a second polysilicon layer for a plate electrode is formed on the dielectric layer.

According to yet further another aspect of the invention, there is provided a method for fabricating a cylindrical storage capacitor for a memory cell. The method comprises the steps of: providing a semiconductor substrate on which a MOSFET having diffused regions is formed; and depositing successively a first insulating layer and an etch stopper layer in the order named on the upper surface of said semiconductor substrate. A through hole is formed at a selected portion of the etch stopper layer and the first insulating layer such that the diffusion region is exposed. Thereafter, the through hole is filled with a conductive plug such that the conductive plug electrically contacts with the diffusion region. Afterwards, a second insulating layer is deposited on the etch stopper layer including the conductive plug. An opening part for exposing a selected portion of the upper surface of the first insulating layer including the upper surface of the conductive plug is formed in the second insulating layer. Thereafter, a first polysilicon pattern layer for a storage electrode is formed within the opening part, the first polysilicon pattern layer being electrically in contact with the conductive plug, and being a cylindrical structure. Afterwards, a hemispherical grain silicon only is grown at inner and upper surfaces of the first polysilicon pattern layer. The second insulating layer is then removed to expose the outer peripheral surface of the first polysilicon layer.

Thereafter, the etch stopper layer is removed to expose the outer bottom surface of the first polysilicon layer. Afterwards, a dielectric layer is formed on the surface of said hemispherical grain silicon, the outer peripheral surface of the first polysilicon layer, and the outer bottom surface of the first polysilicon layer. Finally, a second polysilicon layer for a plate electrode is formed on the dielectric layer.

The outer peripheral surface of the first polysilicon pattern layer for a storage electrode acts as increasing the effective surface area of the storage electrode. In addition, the outer bottom surface of the first polysilicon pattern layer for a storage electrode can also contribute to an increases of an effective surface area of the storage electrode.

Thus, the cylindrical storage capacitor of the invention can makes it possible to obtain an target capacitance by extending the effective surface of the storage electrode. Moreover, the micro bridge between adjacent storage capacitors caused by the hemispherical grain silicon (HGS) when the HGS is formed on the outer peripheral surface of the storage electrode can be substantially prevented. Moreover, misalignment between the storage electrode and the conductive plug can be prevented by extending the effective surface area of the storage electrode.

BRIEF DESCRIPTION OF THE DRAWINGS

The above object and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those having skill in the art.

Figure 1:
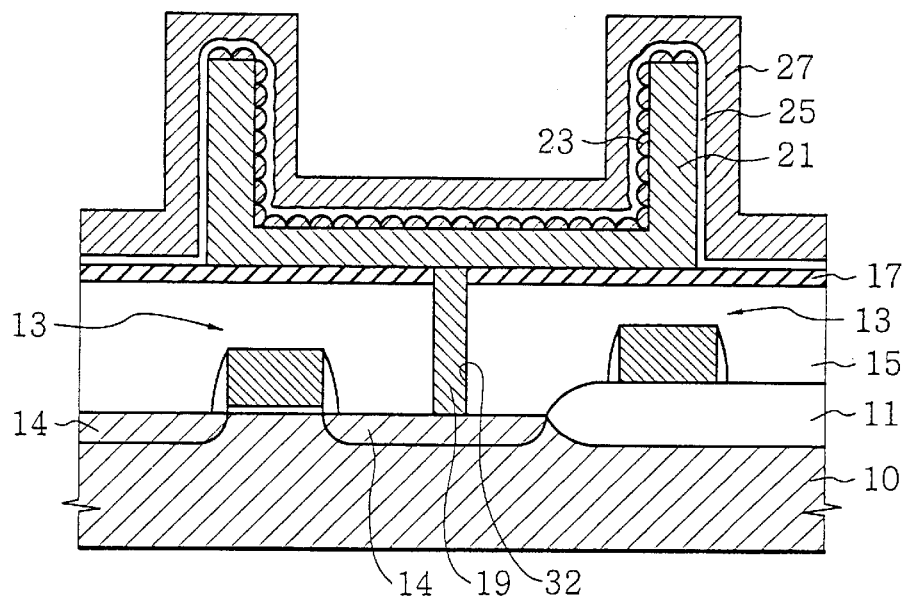
FIG. 1 is a simplified partial sectional view showing a cylindrical storage capacitor for a memory cell according to one embodiment of the present invention.

Referring to FIG. 1, field oxide 11 is grown at a selected non-active region of a semiconductor substrate 10. Word lines 13 are formed on an active region of the semiconductor substrate 10 and the field oxide 11. In the active region between the word lines 13, there is provided a diffusion region 14. As a first insulating layer, an oxide film 15 for planarization is formed on the entire surface of the semiconductor substrate 10 in order to insulate the word lines 13 from each other. A nitride film 17, i.e., an etch stopper film, is stacked on the oxide film 15. For electrical contact with the diffusion region 14, a conductive plug of polysilicon is filled in a through hole formed at a selected portion of the nitride film 17 and the oxide film 15. The conductive plug is planarized at the same level with the top surface of the nitride film 17.

For use as a storage electrode, a first polysilicon pattern layer 21 having a cylindrical structure is formed on a selected portion of the nitride film 17 including the conductive plug 19 and is electrically connected with the conductive plug 19. A hemispherical grain silicon (HGS) 23 is grown only at inner and top surfaces of the first polysilicon pattern layer 21 but not at the outer surface thereof. A dielectric film 25 is deposited on the cylindrical storage electrode 21 including the HGS 23 and the nitride film 17 and a second polysilicon pattern layer 27 for use as a plate electrode is formed on the surface of the dielectric film 25.

Figure 5A:
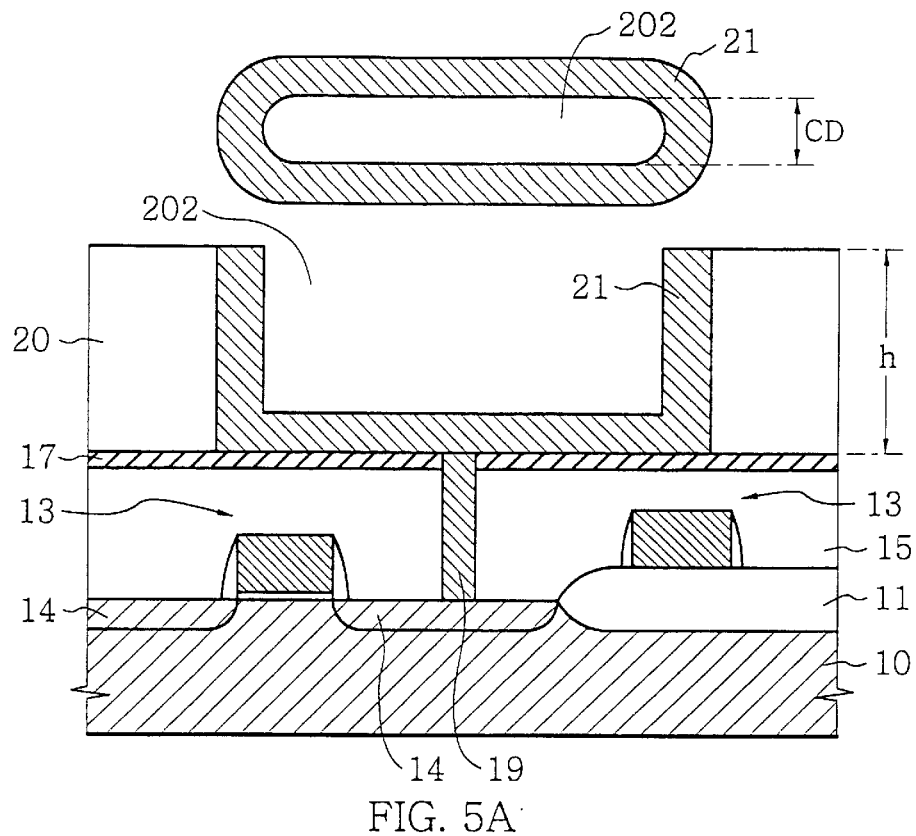

Since the first polysilicon pattern layer 21 has a ellipsoidal cylindrical structure, a critical dimension for the space between inner sidewalls of the cylindrical storage electrode 21 along the short axis should be at least 1000 Å as shown in FIG. 5a, and is determined considering the overall thickness of the HGS 23, the dielectric film 25, and the second polysilicon pattern layer 27 for a plate electrode. Thickness of the first polysilicon pattern layer 21 ranges from 300 Å to 600 Å and that of the nitride film 17 ranges from 500 Å to 2,000 Å.

Here, although FIG. 1 shows that the first polysilicon pattern layer 21 is a single cylindrical structure, the first polysilicon pattern layer 21 may be plural, for example, two or more cylindrical structure.

Thus, since the storage electrode has not only the cylindrical structure but it has the HGS 23 grown at the inner and top surfaces thereof, a target capacitance for the storage capacitor is easily obtained due to the increase in effective surface area of the storage electrode.

Meanwhile, as not shown in the accompanying drawings, storage capacitors having the same structure with that shown in FIG. 1 are formed at adjacent regions. As design rule decreases, the critical dimension between the cylindrical storage electrodes becomes smaller. Therefore, if the HGS 23 exists on the outer surface of the first polysilicon pattern layer 21, micro-bridge between adjacent plate electrodes 27 of the storage capacitors may be frequently occurred. However, since the HGS 23 is not formed on the outer surface of the first polysilicon pattern layer 21 in the present invention, a sufficient interval between the adjacent storage capacitors is secured and thereby twin bits fail therebetween can be substantially prevented.

In addition, since the secured interval allows the storage electrode to have more wide outer bottom surface area, capacitance of the storage capacitor increases and disconnection between the conductive plug 19 and the storage electrode due to the misalignment can be substantially prevented.

Now, a method for fabricating the cylindrical storage capacitor for a memory cell thus structured will be explained in detail with reference to FIGS. 2 to 7.

Figure 2:
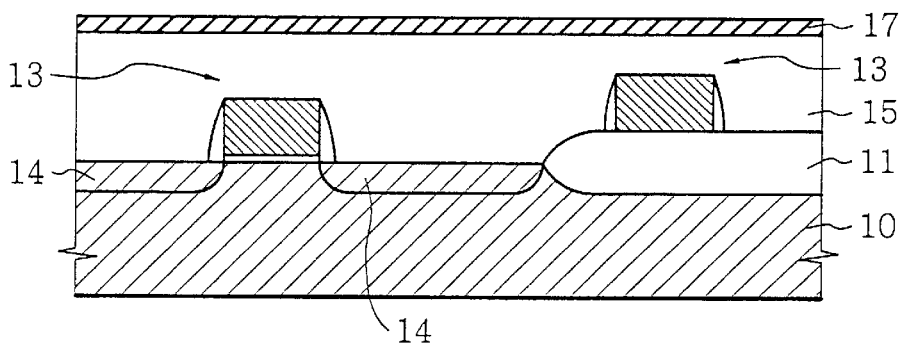
FIGS. 2 to 7 are simplified sectional views showing a method for fabricating the cylindrical storage capacitor for a memory cell of FIG. 1.

Referring to FIG. 2, the field oxide 11 is formed in a selected region of a silicon substrate 10 by local thermal oxidation of the silicon substrate. Here, P-well is formed in the semiconductor substrate 10. Thereafter, word lines 13 are respectively formed on selected regions of the active regions of the semiconductor substrate 10 and the field oxide 11. Of course, a gate insulating film is formed under word lines 13 of the active area.

Then, the diffusion regions 14, i.e., source and drain regions, are formed in the active region of the semiconductor substrate 10 by an n-type ion implantation. Oxide spacers are formed on the sidewalls of the respective word lines 13, to thereby obtain a metal-oxide-semiconductor field effect transistor (MOSFET).

Subsequently, on the resultant semiconductor substrate 10, a first insulating layer, i.e., a planarization film selected from a group including HDP oxide, TEOS, and USG, is deposited and planarized. Then, an etch stopper film, for example, a nitride film 17 is deposited to a thickness of 500 Å to 2000 Å on the first insulating layer 15. The etch stopper film 17 may be omitted, if necessary.

Figure 3:
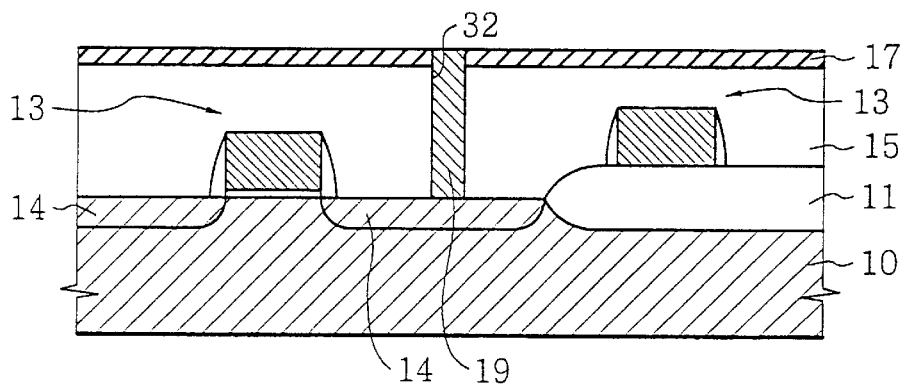

Referring to FIG. 3, predesignated portions of the nitride film 17 and the oxide film 15 are removed so as to form a contact hole for exposing the diffusion region 14.

Subsequently, an impurity-doped polysilicon layer is deposited onto the nitride film 17 including the contact hole so that the conductive plug 19 is electrically connected to the diffusion region 14. The impurity-doped polysilicon layer on the nitride film 17 is completely removed by a chemical and mechanical polishing process, a dry etch-back process, or a photosensitive etch-back process. Thus, the conductive plug 19 is formed only within the contact hole.

Figure 4A:
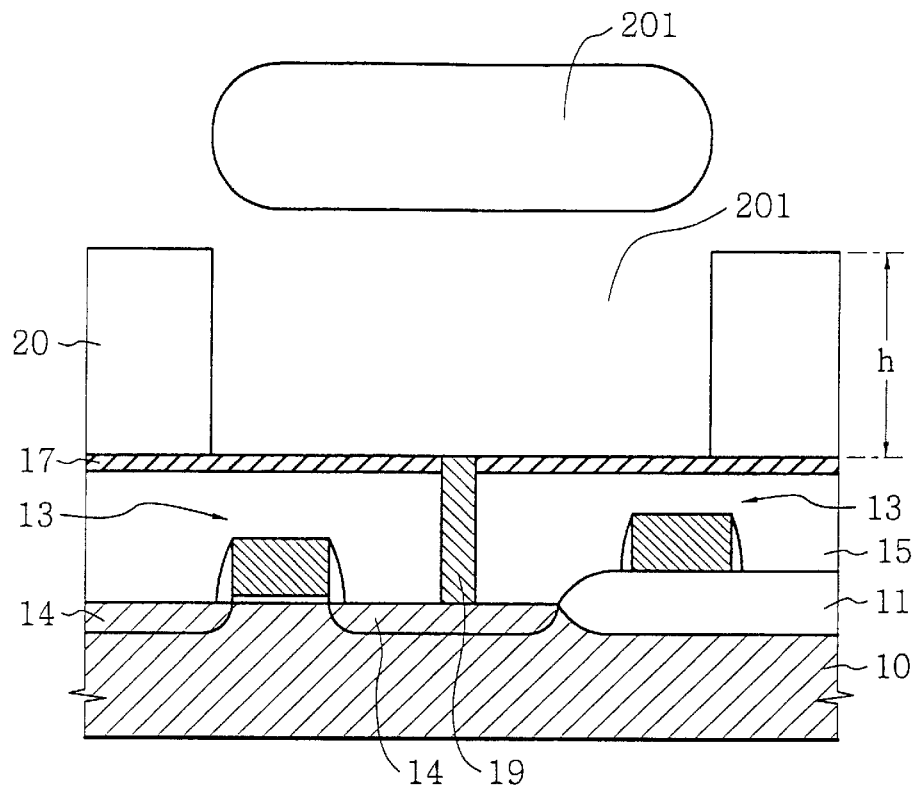

Referring to FIG. 4A, a second insulating layer 20 selected from a group including BPSG, PSG, PE-SiH4, and PE-TEOS, is deposited in a thickness of 6000 Å to 12000 Å and planarized. Thickness of the second insulating layer 20 is determined by the height of the cylindrical storage electrode 21, which will be discussed later.

Then, a predesignated portion of the second insulating layer 20 is dry-etched until the surface of the nitride film 17 is exposed by a photoetching process, to thereby form an opening part 201 which is shaped as an ellipsoid when it is viewed from the top, as shown in FIG. 4A.

If the vertical profile of the opening part 201 is not fine, tails may occur near boundary regions of the inner wall surface and the bottom surface of the opening part 201. To this end, the second insulating layer 20 should be over-etched. The nitride film 17 acts as an etch stopper during over-etch of the second insulating layer 20. Therefore, if the second insulating layer 20 is sufficiently over-etched, the etched surface of the oxide film 20 has an excellent vertical profile without generation of tails. This means that the outer surface of the first polysilicon pattern layer 21 for storage electrode 21 has a fine vertical profile.

In the conventional method, the etch stopper film is not used, which caused difficulty in controlling the vertical profile of the etched surface and in reproducing the same result. In the present invention, the etch stopper film is used to easily control the vertical profile of the etched surface.

Figure 4B:
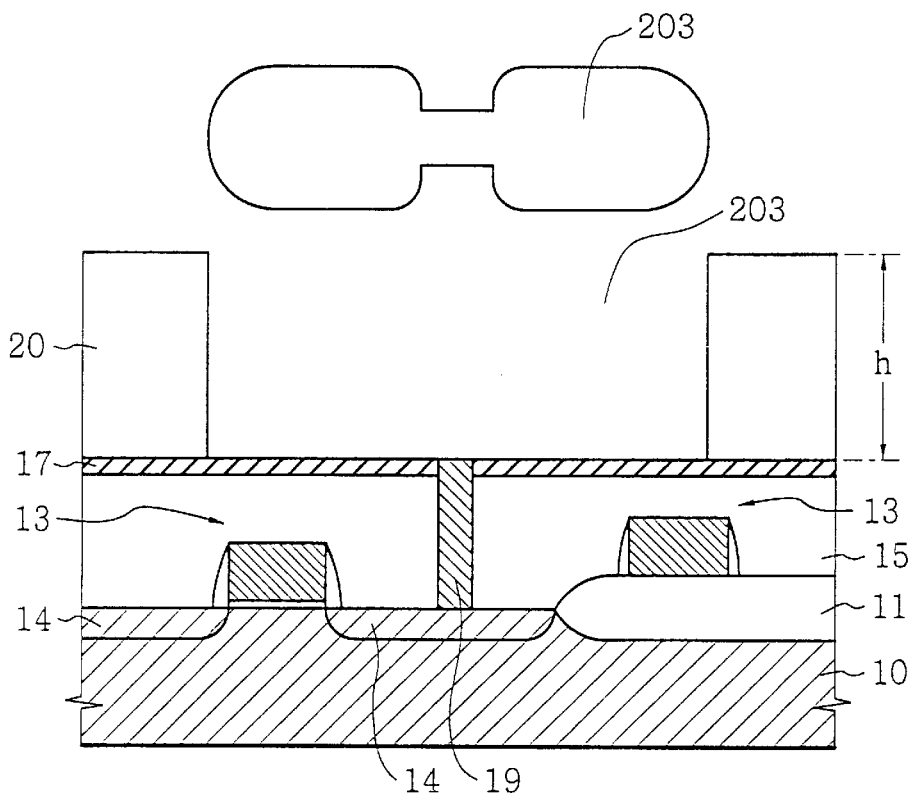

Meanwhile, in order to additively increase the capacitance of the storage capacitor, the storage electrode can have plural, for example, dual cylindrical structure. Now referring to FIG. 4B, predesignated portion of the oxide film 20 is dry-etched until the surface of the nitride film 17 is exposed by a photoetching process. Here, an opening part 203 is formed in a shape of ellipse pattern of which center portion is depressed toward the inside thereof when it is viewed from the top, as shown in FIG. 4B.

As described above, the cylindrical structure is determined by a pattern of a photomask as used. Therefore, in order to form such the opening part 203 shown in FIG. 4B, a photomask having transparent region or opaque region corresponding to the ellipse pattern 203 of FIG. 4B is used.

Referring to FIG. 5A, a polysilicon layer for formation of the storage electrode 21 is deposited on the resultant substrate of FIG. 4A to a thickness of 300 Å to 600 Å. Here, the deposited polysilicon layer is electrically in contact with the conductive plug 19.

Subsequently, the polysilicon layer on the first insulating layer 20, which is positioned at the outer periphery of the opening part 201 is completely removed by a chemical and mechanical polishing process, a dry etch-back process or a photosensitive etch-back process, and thereby the cylindrical storage electrode 21 is formed within the opening part 201.

For formation of the cylindrical storage electrode 21 within the opening part 201, various methods, for example, a chemical and mechanical polishing process, or a dry etchback process can be used.

Figure 4C:
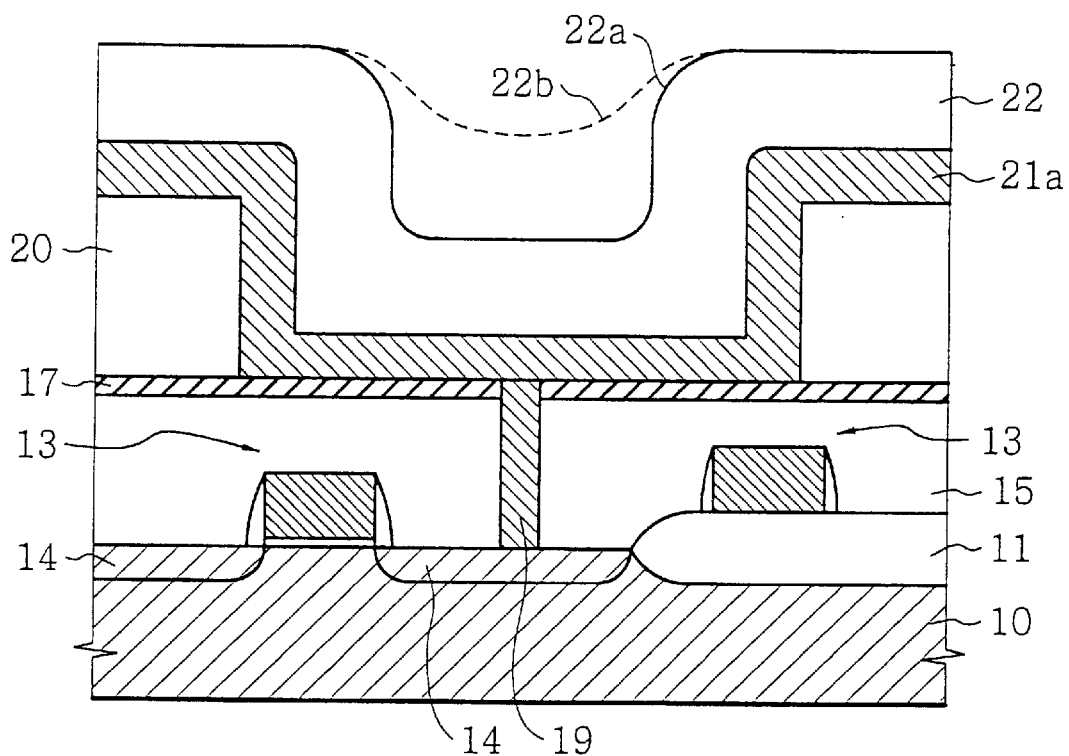

Firstly, an application of the chemical and mechanical polishing process will be described with reference to FIG. 4C.

On the whole surface of the first insulating layer 20 including the opening part 201, a polysilicon layer 20a of a selected thickness, for example, 300 Å to 600 Å is deposited. Here, the selected thickness corresponds to one capable of maintaining the shape of the opening part 201. Thereafter, the resultant substrate is polished by a chemical and mechanical polishing process such that the polysilicon layer 20a on the second insulating layer 20 except the opening part 201 is completely removed. As a result, a resultant substrate of FIG. 5A having a new opening part 202 which is smaller in diameter than the previous opening part 201 is obtained.

Then, the above-described method may cause a drawback that an opening part 202 of the cylindrical polysilicon pattern 21 is filled with a by-product generated during the polishing process.

In order to solve such the drawback, prior to performing the chemical and mechanical polishing process, a process can be selectively performed, which partially 22a or completely 22b fills the opening part 202 with a photosensitive film or a nitride film.

When the nitride film is applied for the filling process, after the chemical and mechanical polishing process is performed, a by-product of the nitride film, remaining in the opening part 202 is removed by a wet etch using phosphoric acid ($H_3PO_4$). Here, the nitride film is deposited in a thickness of 1,000–1,500 Å.

Selectively, when material other than oxide is used as the second insulating layer 20, oxide such as BPSG, USG, high temperature USG, and SOG can be used as the material for filling the opening part 202 of FIG. 5A. Especially, when the diameter of the cylindrical first polysilicon pattern layer 21 is smaller with the decrease in design rule, it is preferable that BPSG, USG, or high temperature USG each having superior planarization property is used.

As the filling material, photosensitive film is used instead of the nitride. At this time, the surface of the second insulating layer except the opening part 201 is exposed by the chemical and mechanical polishing process like the application of the nitride film. End point of the chemical and mechanical polishing process is the top surface of the second insulating layer 20, but the second insulating layer can be over-etched to a selected depth from the top surface thereof for planarization. After performing the chemical and mechanical polishing process, the photosensitive film which is filled in the opening part 202 of the cylindrical first polysilicon pattern layer 21 is removed by ashing process prior to removing the second insulating layer 20.

Meanwhile, when a dry etchback process is applied to, in order to obtain the structure of FIG. 5A, the opening part 202 of the cylindrical first polysilicon pattern layer 21 should be completely filled. If the opening part 202 is partially filled, it occurs that the cylindrical first polysilicon pattern layer 21 is removed together with the filling material during the dry etchback process.

Even after the surface of the second insulating layer 20 is exposed by performing the dry etchback process, the filling material such as photosensitive film or the nitride film remains in the opening part 202 of the cylindrical first polysilicon pattern layer 21. When the remaining material is photosensitive film, it is removed by the ashing process prior to etching the second insulating layer 20, and when the remaining material is nitride, it is removed by the wet etch process using phosphoric acid prior to removing the second insulating layer 20.

When photosensitive film is used as the filling material, the photosensitive film is coated to a thickness greater than that of the second insulating layer 20, for example, 0.5–1.2 μm.

Figure 4D:
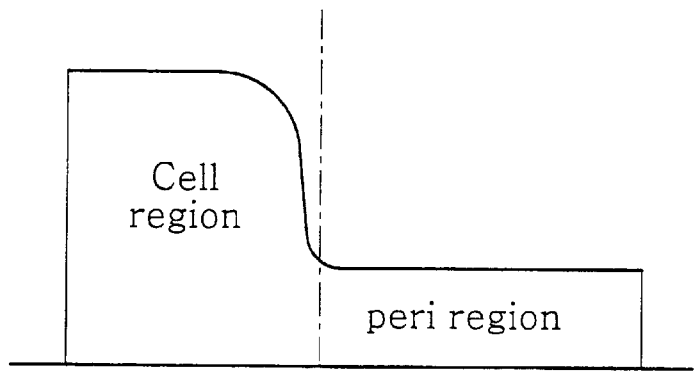

The polishing time becomes longer as the thickness of the filling material increases. Despite such the fact, increasing the coating thickness of the photosensitive film is based on height difference between the cell region and the peripheral region. In other words, when the height difference is large as shown in FIG. 4D, the photosensitive film coated on the cell region flows into the peripheral region, and thereby elements of the cell region may be polished over a desired thickness. To prevent this fail from occurring, the photosensitive film is thickly coated.

When the photosensitive film is coated in a thickness of 1.2 μm, the polishing is performed through two steps. During first polishing step, an etch rate of the photosensitive film over the polysilicon layer 21a is 0.5:1–2:1, and during second polishing step, an etch rate of the second insulating layer 20 over the polysilicon layer 21a is 0.7:1–1.3:1.

The etch process of the polysilicon layer 21a and the second insulating layer 20 can be performed in the same reaction chamber by in-situ manner with changing gas for the etch. Selectively, the reaction chamber may be changed from a first chamber for removing the polysilicon layer 21a to a second chamber for removing the second insulating layer 20.

Figure 5B:
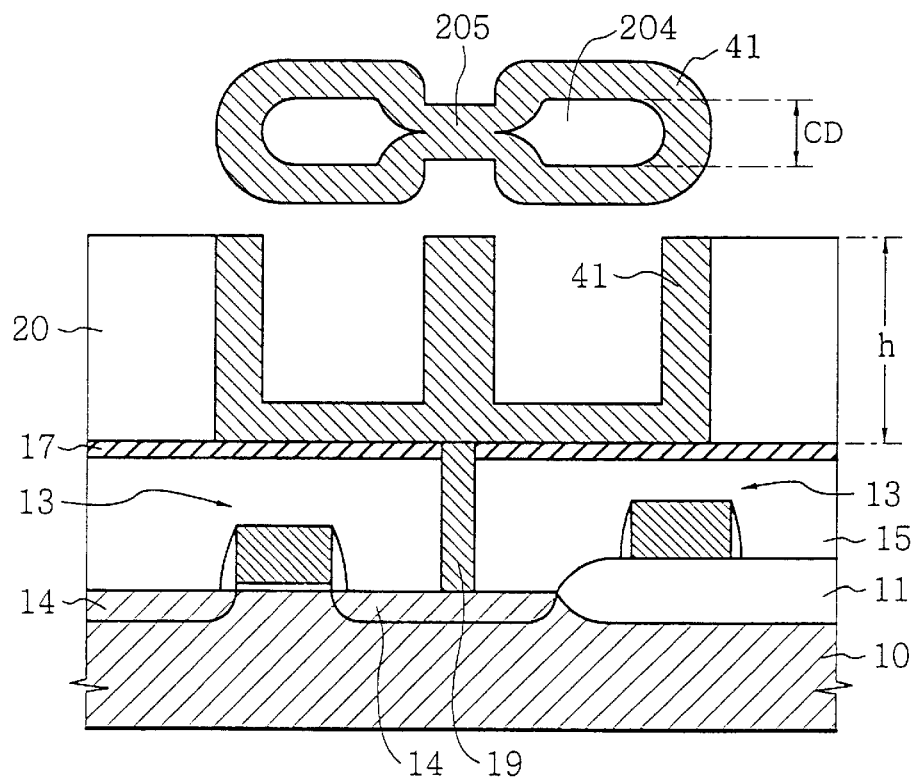

Meanwhile, when the opening part 203 is formed as shown in FIG. 4B, dual cylindrical polysilicon pattern layer 41 is formed as shown in FIG. 5B by depositing polysilicon layer. Here, since a connection part 205 for connecting the two cylindrical pattern layers 204 has a width smaller than that of the two cylindrical pattern layers 204, the connection part 205 is completely filled by depositing polysilicon layer.

The above-described chemical and mechanical polishing process and dry etchback process can be also applied to formation of the dual cylindrical polysilicon pattern layer 41 of FIG. 5B.

As shown in FIGS. 5A and 5B, the height "h" of the cylindrical polysilicon pattern layers 21 and 41 respectively formed in the opening parts 201 and 203 is determined by the thickness of the second insulating layer 20, which serves as an important factor for determining the surface area of the desired storage electrode.

Meanwhile, the critical dimension for the space between the inner sidewalls of the cylindrical structure of the polycrystalline silicon layer 21 is required to be maintained at least 1,000 Å or higher so as to ensure a space in which the HGS 23, the dielectric film 25, and the second polysilicon pattern layer 27 for use of a plate electrode are to be formed.

Figure 6:
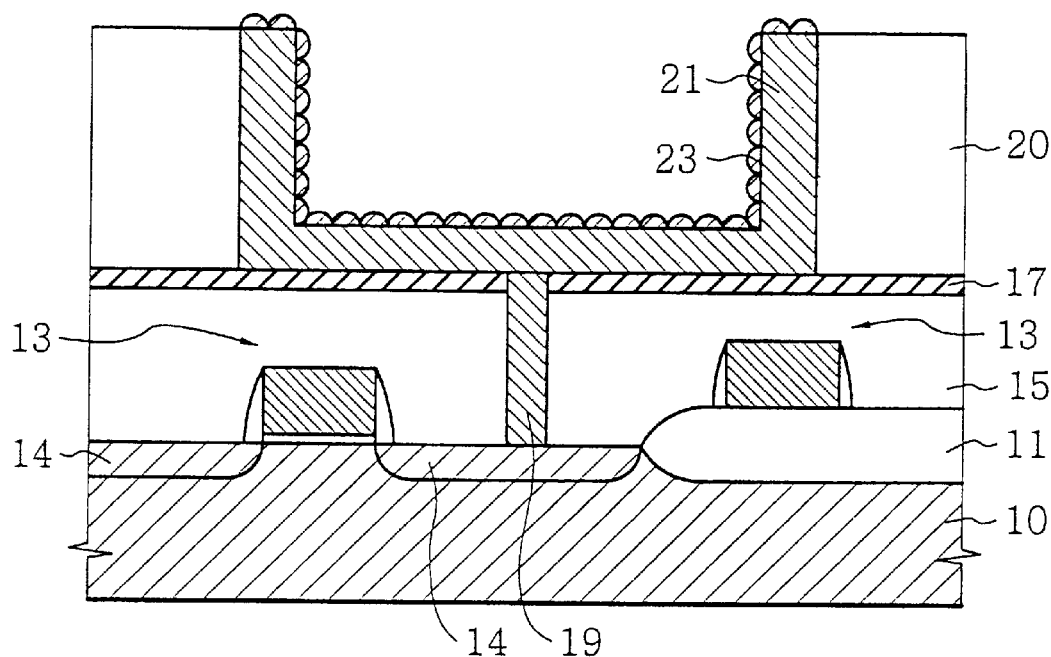

Referring to FIG. 6, the HGS 23 is grown on the surface of the first polysilicon pattern layer 21. The HGS 23 is formed only at the inner and top surfaces of the first polysilicon layer 21 because the second insulating layer 20 covers the outer sidewalls of the first polysilicon pattern layer 21. This lowers the possibility of occurrence of a micro bridge between adjacent storage capacitors caused by existence of the HGS 23 at the outer sidewalls of the first polysilicon pattern layers 21, 41, which increases a margin of the critical dimension for the space for the micro bridge and the surface area of the storage electrode. As a result, a capacitance of the storage capacitor is increased, and the contact area between the buried contact and the storage electrode is extended, thereby increasing a margin for prevention of a misalignment between the storage electrode and the conductive plug.

Figure 7:
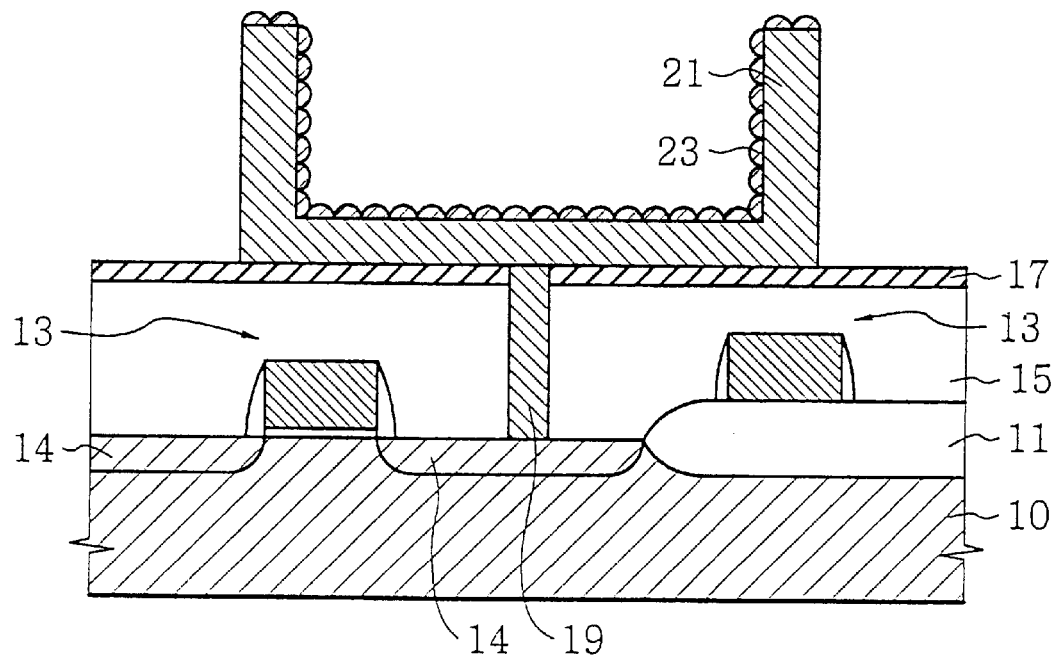

Referring to FIG. 7, the second insulating layer 20 is removed by a wet-etch process using the nitride film 17 as an etch stopper film, thereby exposing the outer sidewalls of the polycrystalline silicon layer 21.

As a final step, the dielectric film 25 and the second polysilicon layer 27 are successively deposited overlying the first polysilicon pattern layer 21 and the HGS 23 in the order named. Then, the second polysilicon layer 27 is patterned to form a plate electrode by a photoetching process. Thus, the storage capacitor for each memory cell as shown in FIG. 1 is completed.

Meanwhile, although the storage electrode is formed in the structure of FIG. 5B, the method described in FIGS. 6 and 7 is applied to the subsequent processes.

Now, another embodiment of the present invention and a method for fabricating the same will be explained with reference to FIGS. 8–10.

Figure 8:
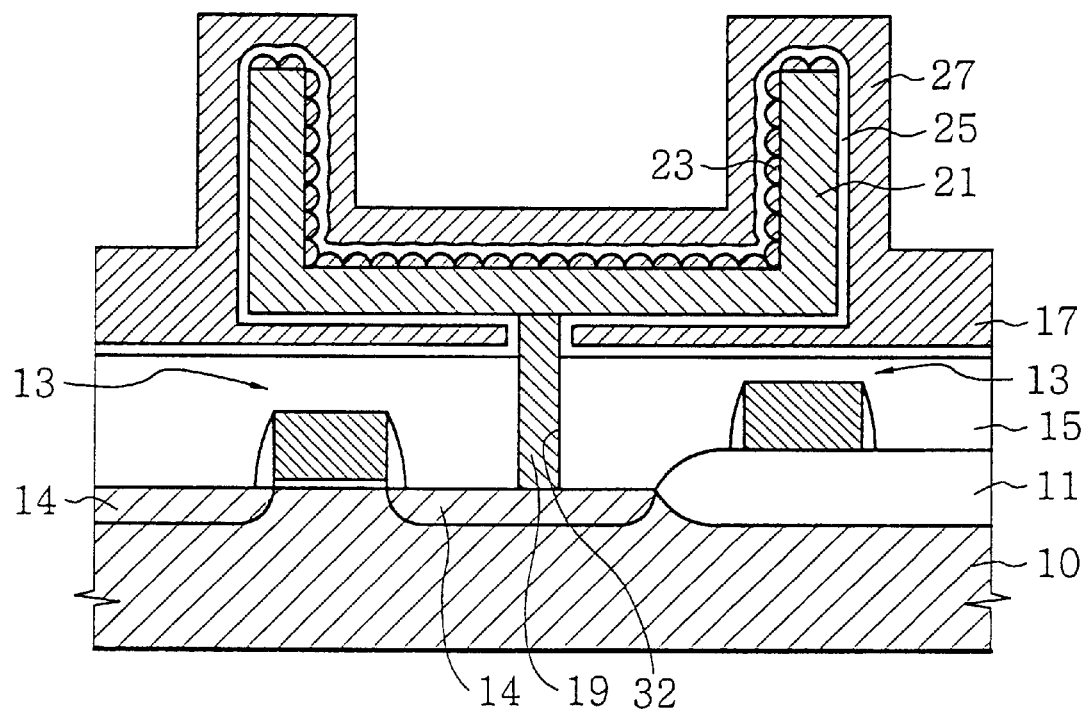
FIG. 8 is a simplified sectional view showing a cylindrical storage capacitor for a memory cell according to a further another embodiment of the present invention.

Referring to FIG. 8, the field oxide 1 is grown in the field area of the semiconductor substrate 10, and the word lines 13 are formed in the active area of the semiconductor substrate 10 and on the field oxide 11. The first insulating layer 15 such as oxide for planarization is formed on the resultant substrate 10 including the word lines to insulate the word lines 13. A conductive plug 19 made of polysilicon fills the contact hole which penetrates vertically through the designated areas of the nitride film 17 and the oxide film 15 so as to be electrically connected to the diffusion area 14 of the semiconductor substrate 10, located between word lines 13. The top surface of the conductive plug 19 is formed higher than that of the oxide film 15.

The first polysilicon pattern layer 21 for use of a storage electrode is formed on the conductive plug 19, being electrically connected to the conductive plug 19, thereby separating the outer bottom surface of the first polysilicon pattern layer 21 from the top surface of the first insulating layer 15. The HGS 23 is grown only at the inner and top surfaces of the first polysilicon pattern layer 21. Then, the dielectric film 25 and the second polysilicon pattern layer 27 for use of a plate electrode are successively formed on the top, inner, and outer surfaces of the first polysilicon pattern layer 21.

The critical dimension for the space between the inner sidewalls of the polycrystalline silicon layer 21 is required to be at least 1,000 Å or higher considering the total thickness of the HGS 23, the dielectric film 25, and the second polysilicon pattern layer 27 for use of a plate electrode. The first polysilicon pattern layer 21 has a thickness of 300 Å to 600 Å.

To widen area of the dielectric film 25, the present embodiment removes the nitride film 17 from the structure of FIG. 7, and disposes the dielectric film 25 and the plate electrode 27 at the place where the nitride film 17 is positioned. That is, the dielectric film 25 is extended to selected positions of the top surface of the conductive plug 19 and the surface of the first insulating layer 15.

Meanwhile, although FIG. 8 shows that the first polysilicon pattern layer 21 is formed to have one cylindrical structure, the first polysilicon pattern layer may have plural, for example, two or more cylindrical structures like the previously described embodiment.

Thus, according to the present embodiment, the HGS 23 is grown only at the inner and top surfaces of the cylindrical first polysilicon pattern layer 21. As a result, effective surface area of the storage electrode is increased and capacitance thereof is also increased compared with that of a storage electrode without the HGS 23. Also, an additive margin is generated between adjacent storage capacitors by height of the HGS 23 due to the non-existence of the HGS 23 on the outer wall surface of the cylindrical first polysilicon pattern layer 21. This widens the area of the outer bottom surface of the cylindrical first polysilicon pattern layer 21, to thereby prevent the cylindrical first polysilicon pattern layer 21 from misaligning each other.

Hereinbelow, a method for fabricating the cylindrical capacitor for a memory cell having the constitution of FIG. 8 will be described with reference to FIGS. 9 and 10.

Figure 9:
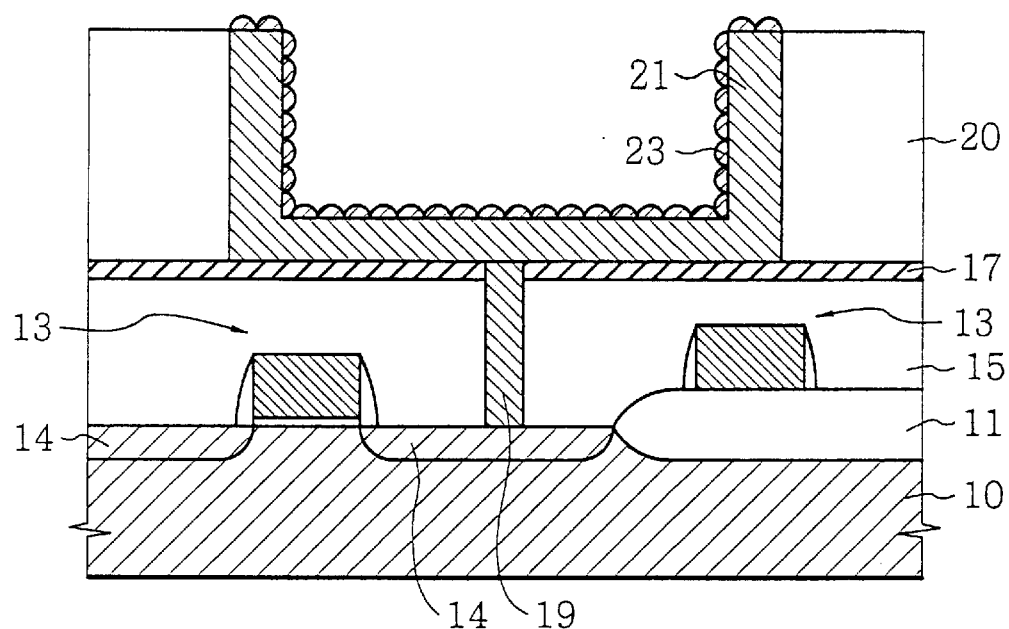
FIGS. 9 and 10 are simplified sectional views showing a method for fabricating the cylindrical storage capacitor for a memory cell of FIG. 8.

Referring to FIG. 9, by performing processes of FIG. 2 to FIG. 6, the HGS 23 is grown only at the inner and top surfaces of the cylindrical first polysilicon pattern layer 21, but is not grown at the outer peripheral surface of the cylindrical first polysilicon pattern layer 21.

Figure 10:
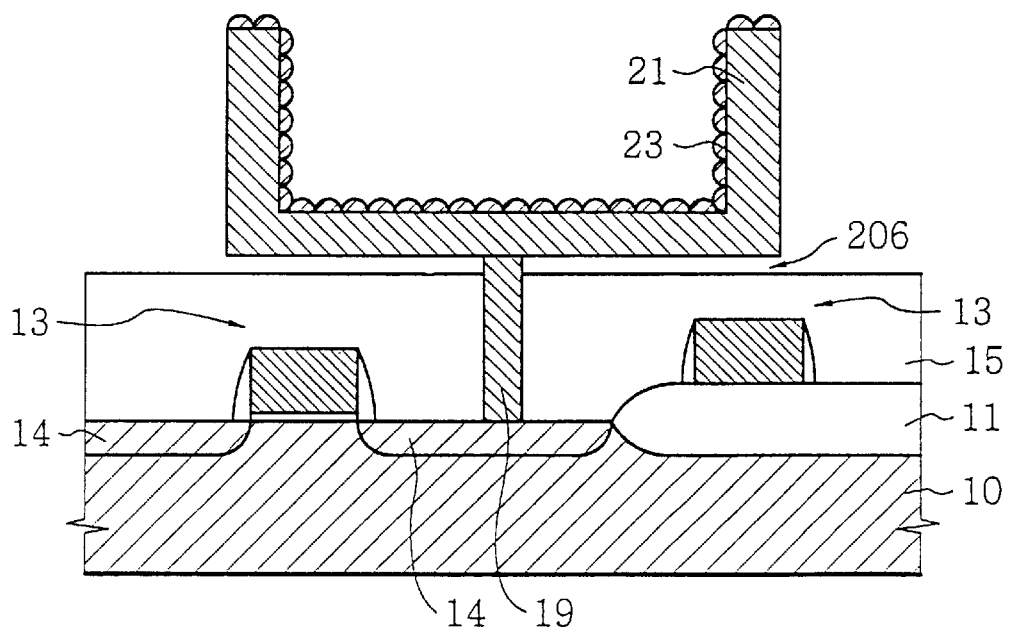

Referring to FIG. 10, the outer peripheral surface of the cylindrical first polysilicon pattern layer 21 is exposed by performing the processes of FIG. 7. Thereafter, the nitride film 17 for use of an etch stopper is removed by wet etch using phosphoric acid. During the etch process of the nitride film 17, the portion of the nitride film 17 positioned between the outer bottom surface of the cylindrical first polysilicon pattern layer 21 and the top surface of the first insulating layer 15 is also undercut, and a space between them is formed, to thereby expose the outer bottom surface of the cylindrical first polysilicon pattern layer 21. Here, the area of the exposed bottom surface of the cylindrical first polysilicon pattern layer 21 can be controlled if necessary. Thus, the storage electrode provided in FIG. 10 has the effective surface area wider than the storage electrode provided in FIG. 7, which means securing more greater capacitance.

Here, the nitride film 17 should be designated in a thickness of 300–2,000 Å considering that both of the dielectric layer 25 and the second polysilicon pattern layer 27 is interposed between the top surface of the first insulating layer 15 and the outer bottom surface of the cylindrical first polysilicon pattern layer 21.

Finally, as shown in FIG. 8, the dielectric film 25 and the second polysilicon pattern layer 27 are successively deposited on the resultant structure including the cylindrical first polysilicon pattern layer 21 and the HGS 23, and are then patterned to respectively function as the dielectric layer and the plate electrode by a photoetching process.

Meanwhile, although the present embodiment shows and describes that the cylindrical first polysilicon pattern layer 21 has single cylinder structure, as shown in FIGS. 4B and 5B, it can be naturally applied to a case that the cylindrical first polysilicon layer has plural, for example, dual cylinders.

In addition, although the present embodiments show and describe that the HGS is grown only at the inner and top surfaces of the first polysilicon pattern layer, the objects of the present invention mentioned previously can be partially attained by the first polysilicon pattern layer having at least two cylinders without forming the HGS.

As described previously, according to cylindrical storage capacitor for a memory cell and method for fabricating the same, a micro-bridge between adjacent storage capacitors can be prevented by forming the HGS only at the inner and top surfaces of the first polysilicon pattern layer. Also, an additive margin is generated between adjacent storage capacitors by height of the HGS due to the non-existence of the HGS on the outer wall surface of the cylindrical first polysilicon pattern layer. This widens the area of the outer bottom surface of the cylindrical first polysilicon pattern layer, to thereby prevent the cylindrical first polysilicon pattern layer and the conductive plug from misaligning each other. Moreover, the cylindrical first polysilicon pattern layer of which the outer peripheral surface have a fine vertical profile can be obtained by applying the nitride film as an etch stopper when forming the opening part in a selected portion of the first insulating layer.

This invention has been described above with reference to the aforementioned embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. A method of forming an integrated circuit capacitor, comprising the steps of:

forming an insulating layer on a surface of a semiconductor substrate;

patterning the insulating layer to define an opening therein that has a constricted neck when viewed orthogonal to the surface of the insulating layer;

depositing a conductive layer onto the insulating layer and into the opening so that the conductive layer conforms to a shape of the opening outside the constricted neck but fills the opening at a first location adjacent the constricted neck;

planarizing the conductive layer to expose the insulating layer and define a lower capacitor electrode having dual annular sections therein that are joined together at the first location;

forming a capacitor dielectric layer on the lower capacitor electrode; and forming an upper capacitor electrode that extends opposite the lower capacitor electrode, on the dielectric layer.

2. The method of claim 1, wherein a thickness of the conductive layer is less than a thickness of the insulating layer.

3. The method of claim 2, wherein said planarizing step is preceded by the step of depositing a filling material selected from the group consisting of nitrides and photoresists into the opening and onto the conductive layer therein.

4. The method of claim 2, wherein said planarizing step is preceded by the step of depositing a nitride filling material into the opening and onto the conductive layer therein; and wherein said planarizing step is followed by the step of removing the nitride filling material using a phosphoric acid etching solution.

5. The method of claim 2, wherein said planarizing step is preceded by the step of depositing a photoresist filling material into the opening and onto the conductive layer therein; and wherein said planarizing step is followed by the step of removing the photoresist filling material using an ashing process.

6. The method of claim 2, wherein said step of forming a capacitor dielectric is preceded by the step of forming an HSG layer on the lower capacitor electrode.

* * * * *